United States Patent
Kushitani et al.

(10) Patent No.: US 6,856,187 B2
(45) Date of Patent: Feb. 15, 2005

(54) HIGH FREQUENCY SWITCH MODULE

(75) Inventors: Hiroshi Kushitani, Osaka (JP); Yasushi Nagata, Kyoto (JP); Takeo Yasuho, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/696,646

(22) Filed: Oct. 29, 2003

(65) Prior Publication Data

US 2004/0135600 A1 Jul. 15, 2004

(30) Foreign Application Priority Data

Oct. 30, 2002 (JP) ........................................ 2002-315708

(51) Int. Cl.$^7$ .............................................. H03K 17/04
(52) U.S. Cl. ....................... 327/374; 333/132; 333/133
(58) Field of Search ............................... 333/100, 101, 333/117, 103, 126, 129, 132, 133; 327/374, 376, 377

(56) References Cited

U.S. PATENT DOCUMENTS

| | | | | |
|---|---|---|---|---|
| 5,519,364 A | * | 5/1996 | Kato et al. ................... | 333/103 |
| 6,525,624 B1 | * | 2/2003 | Hikita et al. ................. | 333/133 |
| 6,606,015 B2 | * | 8/2003 | Uriu et al. .................... | 333/132 |
| 6,646,587 B2 | * | 11/2003 | Funai ........................ | 342/26 R |
| 6,683,512 B2 | * | 1/2004 | Nakamata et al. .......... | 333/126 |
| 6,714,099 B2 | * | 3/2004 | Hikita et al. ................ | 333/133 |

FOREIGN PATENT DOCUMENTS

JP  11-225088  8/1999

* cited by examiner

Primary Examiner—Tuan T. Lam
Assistant Examiner—Hiep Nguyen
(74) Attorney, Agent, or Firm—RatnerPrestia

(57) ABSTRACT

A high frequency switch module can handle transmit-receive signals of different frequency bands and realize excellent isolation. The high frequency switch module comprises a discriminating filter, a low-band high frequency switch, and a high-band frequency switch, wherein high-band 90-degree phase shifter that forms at least a high-band high frequency switch is configured by a high-pass filter, and a choke line is parallel-connected to the high-pass filter.

3 Claims, 3 Drawing Sheets

HIGH FREQUENCY SWITCH MODULE

FIELD OF THE INVENTION

The present invention relates to a high frequency switch module for discriminating at least two transmit-receive signals of different frequency bands into respective transmit signals or receive signals.

BACKGROUND OF THE INVENTION

Recent developments in the field of cellular phones include a system in which a plurality of different transmit-receive signals can be handled with one portable terminal.

For the configuration of such portable terminal, it is usually necessary to have a high frequency switch module comprising discriminating filter 102, low-band high frequency switch 103, and high-band high frequency switch 104 as shown in FIG. 3. A plurality of different transmit-receive signals are input/output to the discriminating filter 102 via common input/output port 101 connected to an antenna (not shown in FIG. 3) corresponding to the transmit-receive signals. The discriminating filter 102 serves to discriminate the transmit-receive signals into high-band transmit-receive signals and low-band transmit-receive signals. The low-band high frequency switch 103 and the high-band high frequency switch 104 serve to discriminate each of the transmit-receive signals discriminateed by the discriminating filter 102 further into transmit signal and receive signal.

A conventional high frequency switch module is configured in that the discriminating filter 102 is a combination of low-pass filter 105 and high-pass filter 106. Also, the low-band high frequency switch 103 and the high-band high frequency switch 104 are configured by switch element 107 such as PIN diode and 90-degree phase shifter 108 which comprises a λ/4 type strip line of transmit signal.

A conventional high frequency switch module is also disclosed, for example, in Japanese Laid-open Patent H11-225088.

In the signal transmitting mode, the transmit signal is input to low-band transmitting port 109 or high-band transmitting port 110 after being amplified by power amplifier (not shown) positioned ahead of the port. However, in low-band transmit signal of low frequency band, the amplification factor of the power amplifier is far greater as compared with that in high-band transmit signal. Accordingly, there arises a problem such that the low-band transmit signal input from the low-band transmitting port 109 leaks into the high-band receiving port 111.

However, in the high-band receiving path from the common input/output port 101 to the high-band receiving port 111, possible elements that may attenuate the leak signal are the high-pass filter 106 configuring the discriminating filter 102, and the 90-degree phase shifter 108 configuring the high-band high frequency switch 104. However, the strip line configuring the 90-degree phase shifter 108 functions as a low-pass filter in high-frequency domain, and also, the frequency band of the low-band transmit signal to be the leak signal is set lower than the frequency band of the high-band transmit-receive signal. Therefore, the high-pass filter 106 configuring the discriminating filter 102 is only element that may attenuate the leak signal.

That is, in this high frequency switch module, it is difficult to prevent the low-band transmit signal input from the low-band transmitting port 109 from leaking into the high-band receiving port 111, that is, to improve the isolation characteristic.

SUMMARY OF THE INVENTION

A high frequency switch module, comprising:
a discriminating filter which discriminates a receive signal into a high-band receive signal and a low-band receive signal, and respectively outputs the signals to a high-band input/output port and a low-band input/output port, and combines a high-band transmit signal input to the high-band input/output port with a low-band transmit signal input to the low-band input/output port;
a low-band high frequency switch for switching an operation of feeding the low-band receive signal from the low-band input/output port to a low-band receiving port and an operation of feeding a low-band transmit signal fed to a low-band transmitting port to the low-band input/output port; and
a high-band high frequency switch for switching an operation of feeding the high-band receive signal from the high-band input/output port to a high-band receiving port and an operation of feeding a high-band transmit signal fed to a high-band transmitting port to the high-band input/output port,
  wherein the high-band high frequency switch comprises:
  a first switch element connected between the high-band input/output port and the high-band transmitting port;
  a second switch element with one end connected to the high-band receiving port and the other end grounded;
  a high-band 90-degree phase shifter connected between the high-band input/output port and the high-band receiving port; and
  a high-band control port for controlling on-off operations of the first switch element and the second switch element;
  wherein the low-band high frequency switch comprises:
  a third switch element connected between the low-band input/output port and the low-band transmitting port;
  a fourth switch element with one end connected to the low-band receiving port and the other end grounded;
  a low-band 90-degree phase shifter connected between the low-band input/output port and the low-band receiving port; and
  a low-band control port for controlling on-off operations of the third switch element and the fourth switch element; and
  wherein at least one of the high-band 90-degree phase shifter and the low-band 90-degree phase shifter comprises:
  a high-pass filter circuit; and
  a choke line parallel-connected to the high-pass filter circuit, which is a conducting path of control voltage applied from the high-band control port or the low-band control port.

DETAILED DESCRIPTION OF THE EXAMPLARY EMBODIMENTS

The present invention is intended to solve the above problems and to provide a high frequency switch module improved in isolation characteristic.

The exemplary embodiments of the present invention will be described in the following with reference to FIG. 1.

Figure 1:
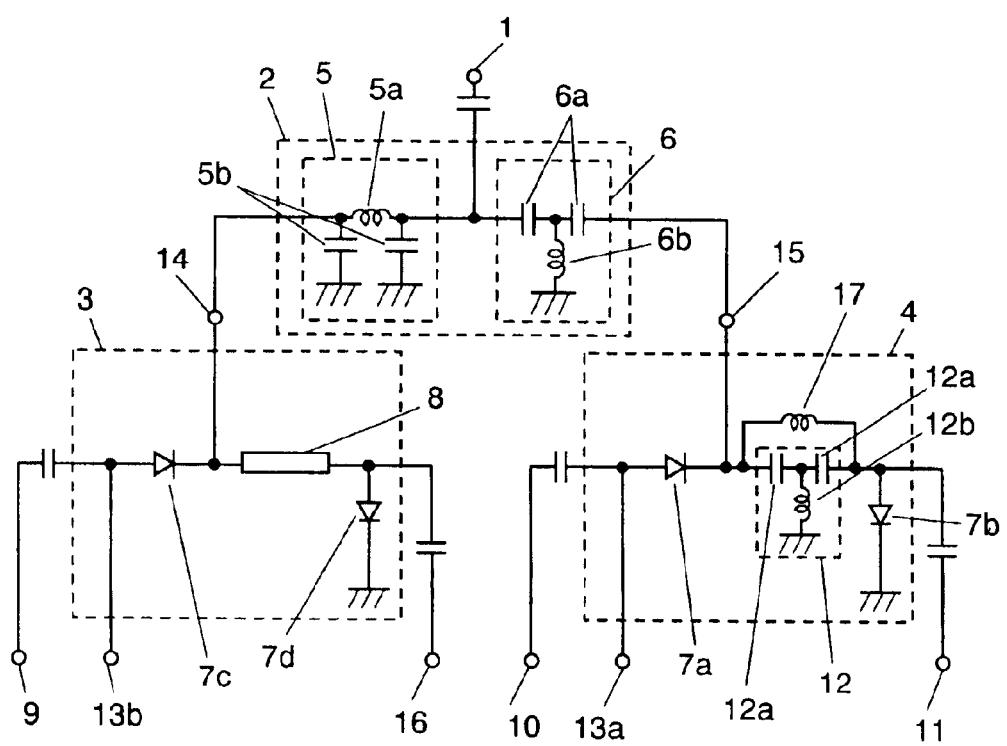
FIG. 1 is a circuit diagram of a high frequency switch module in one exemplary embodiment of the present invention.

FIG. 1 shows a high frequency switch module for discriminating transmit-receive signals of different frequency bands into respective transmit signals or receive signals. Specifically, it is an example of a high frequency switch module for executing the channel separation and combination of GSM communication system (Global System For Mobile Communications) and DCS communication system (Digital Cellular System) in the European cellular phone system by means of an RF block in one cellular phone. The transmit-receive signal of GSM communication system is an example of low-band transmit-receive signal, and the transmit-receive signal of DCS communication system is an example of high-band transmit-receive signal.

This high frequency switch module comprises discriminating filter 2, low-band high frequency switch 3, and high-band high frequency switch 4. The antenna (not shown in FIG. 1) corresponding to both of GSM communication system and DCS communication system is connected to the common input/output port 1 of the discriminating filter 2. The discriminating filter 2 separates the signal input from the antenna via the common input/output port 1, and outputs the receive signal of GSM communication system, that is low-band receive signal, to the low-band input/output port 14, and the receive signal of DCS communication system, that is high-band receive signal, to the high-band input/output port 15. Also, the discriminating filter 2 combines the transmit signal of GSM communication system, that is low-band transmit signal input to the low-band input/output port 14, with the transmit signal of DCS communication system, that is high-band transmit signal input to the high-band input/output port 15, and outputs the signal to the common input/output port 1. The low-band high frequency switch 3 serves for switching an operation of feeding the receive signal of GSM communication system, that is low-band receive signal from the low-band input/output port 14, to the low-band receiving port 16, and an operation of feeding the transmit signal of GSM communication system, that is low-band transmit signal input to the low-band transmitting port 9, to the low-band input/output port 14. Also, the high-band high frequency switch 4 serves for switching an operation of feeding the receive signal of DSC communication system, that is high-band receive signal from the high-band input/output port 15, to the high-band receiving port 11, and an operation of feeding the transmit signal of DCS communication system, that is high-band transmit signal input to the high-band transmitting port 10, to the high-band input/output port 15.

The discriminating filter 2 comprises π-type low-pass filter 5 grounded by capacitors 5b at both ends of inductor 5a, and T-type high-pass filter 6 grounded by inductor 6b between two capacitors 6a. The low-band high frequency switch 3 comprises PIN diode 7c that is the third switch element, PIN diode 7d that is the fourth switch element, and low-band 90-degree phase shifter 8. The high-band high frequency switch 4 comprises PIN diode 7a that is the first switch element, PIN diode 7b that is the second switch element, and high-band 90-degree phase shifter 12.

And, the low-band high frequency switch 3 (or high-band high frequency switch 4) is applied control voltage to the low-band control port 13b (or high-band control port 13a), thereby turning ON the two PIN diodes 7c and 7d (or switch elements 7a and 7b), and then the low-band transmit signal (or high-band transmit signal) input from the low-band transmitting port 9 (or high-band transmitting port 10) is transported to the low-band input/output port 14 (or high-band input/output port 15). When the application of control voltage to the low-band control port 13b (or high-band control port 13a) is discontinued, the two PIN diodes 7c and 7d (or PIN diodes 7a and 7b) are turned OFF, and then the low-band receive signal (or high-band receive signal) input from the low-band input/output port 14 (or high-band input/output port 15) is transported to the low-band receiving port 16 (or high-band receiving port 11).

Here, a comparison is made with respect to the low-band 90-degree phase shifter 8 disposed in the low-band high frequency switch 3 and the high-band 90-degree phase shifter 12 disposed in the high-band high frequency switch 4. In the low-band high frequency switch 3 for processing GSM transmit-receive signals, a strip line is used for shifting the phase by 90 degrees. On the other hand, in the high-band high frequency switch 4 for processing DCS transmit-receive signals, a high-pass filter grounded via inductor 12b at the connection point of two series-connected capacitors 12a is used as the high-band 90-degree phase shifter 12.

The high-band 90-degree phase shifter 12 prevents the leak signal from being transported to the high-band receiving port 11 when the power level of the transmit signal input from the low-band transmitting port 9 or GSM transmitting port is too high and the leak signal cannot be attenuated by the discriminating filter 2. Accordingly, the high-band 90-degree phase shifter 12 improves the so-called isolation characteristic of high-frequency switch module.

Figure 3:
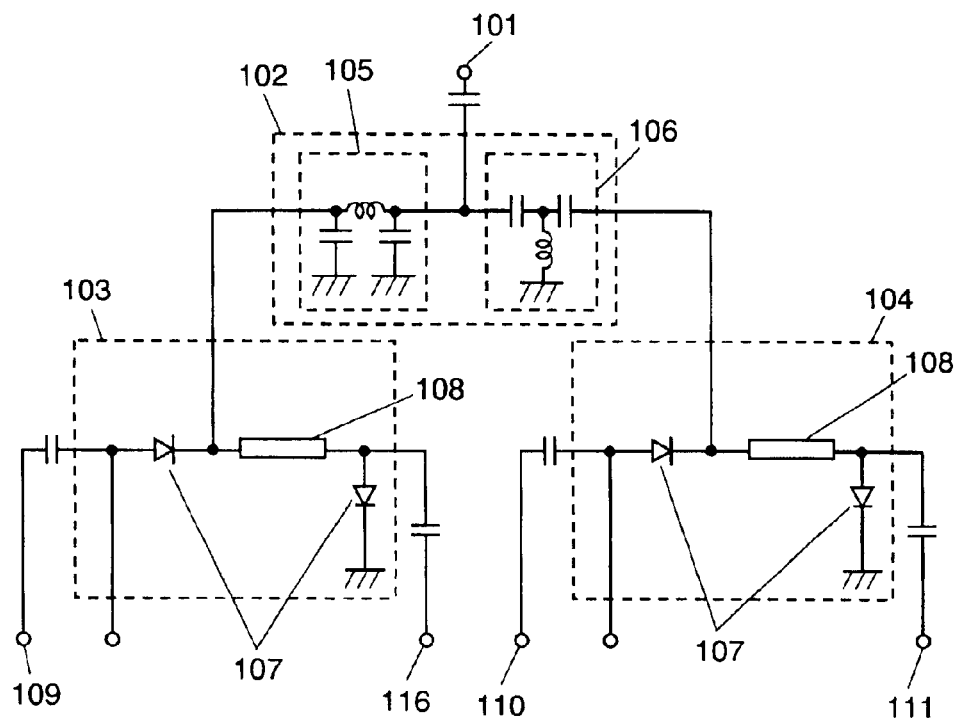
FIG. 3 is a circuit diagram of a conventional high frequency switch module.

In a conventional high-frequency switch module shown in FIG. 3, only the circuit which may attenuate the low-band transmit signal in the path from the low-band transmitting port 109 to the high-band receiving port 111 is the high-pass filter 106 having a function for attenuation at lower frequency than passband. On the other hand, in the high frequency switch module shown in FIG. 1, the high-band 90-degree phase shifter 12 that forms the high-band high frequency switch 4 is configured by a high-pass filter having a function for attenuation at lower frequency than passband. Accordingly, GSM transmit signal (low-band transmit signal) in the path from the common input/output port 1 to the high-band receiving port (DCS receiving port) 11 is attenuated two times, that is, at the high-pass filter 6 configuring the discriminating filter 2 and at the high-pass filter configuring the high-band 90-degree phase shifter 12 of the high-band high frequency switch 4. As a result, it is possible to improve the isolation characteristic of the high frequency switch module.

Further, in the configuration of FIG. 1, the strip line that formed high-band 90-degree phase shifter 108 in prior art shown in FIG. 3 is replaced with a high-pass filter formed of two series-connected capacitors 12a. Accordingly, the length of the high-band receiving path (DCS receiving path) is shortened. As a result, it is also possible to lessen the insertion loss of the high-band receiving path (DCS receive signal).

In the configuration of FIG. 1, the high-band 90-degree phase shifter 12 of the high-band high frequency switch 4 (DCS high frequency switch) is configured by a high-pass filter. In the present invention, similar effects can be obtained even in case the low-band 90-degree phase shifter 8 of the low-band high frequency switch 3 (GSM high frequency switch) is configured by a high-pass filter.

When the high-band 90-degree phase shifter 12 is configured by a high-pass filter, choke line 17 is parallel-connected to the high-pass filter in order to maintain a conduction path of control voltage to two PIN diodes 7a and 7b.

Figure 2:
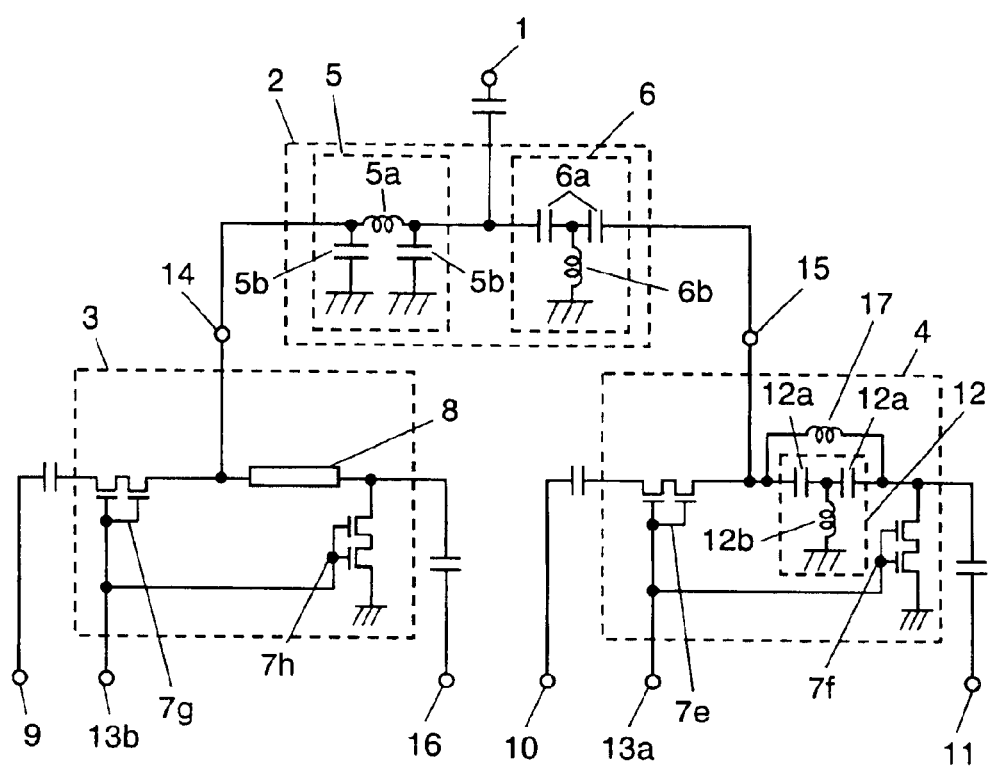
FIG. 2 is a circuit diagram of a high frequency switch module in another exemplary embodiment.

In FIG. 1, PIN diodes 7a to 7d are used as switch elements. The switch elements in the high frequency switch module of the present invention are not limited to PIN diodes. FIG. 2 shows another example of using FET element as the switch element.

In FIG. 2, the difference from FIG. 1 is that FET elements 7e to 7h are used as the switch elements. The other components are same as in FIG. 1, which are provided with same reference numerals as those in FIG. 1, and the detailed description is omitted. The gates of FET elements 7g and 7h are connected to the low-band control port 13b, and the gates of FET elements 7e and 7f are connected to the high-band control port 13a. The on-off operation of FET element 7g and 7h is controlled by the control voltage fed to the low-band control port 13b, and the on-off operation of FET element 7e and 7f is controlled by the control voltage applied to the high-band control port 13a.

As shown in FIG. 2, similar effects can also be obtained with a configuration using FET elements 7e to 7h as switch elements.

In the above description, the transmit-receive signals of GSM communication system are mentioned as low-band transmit-receive signals, and the transmit-receive signals of DCS communication system are mentioned as high-band transmit-receive signals. However, the high frequency switch module of the present invention is not limited to the transmit-receive signals of GSM communication system or the transmit-receive signals of DCS communication system.

As described above, in the present invention, a high-band 90-degree phase shifter that forms a high-band high frequency switch at least in a high frequency switch module is especially configured by a high-pass filter, and also, a choke line is parallel-connected to the high-pass filter. In this way, the high-pass filter characteristic is added to the attenuation characteristic of the discriminating filter, and as a result, the isolation characteristic of the low-band transmit signals at high-band receiving port can be improved.

What is claimed is:

1. A high frequency switch module, comprising:
    a discriminating filter which discriminates a receive signal into a high-band receive signal and a low-band receive signal, and respectively outputs the signals to a high-band input/output port and a low-band input/output port, and combines a high-band transmit signal input to the high-band input/output port with a low-band transmit signal input to the low-band input/output port;
    a low-band high frequency switch for switching an operation of feeding the low-band receive signal from the low-band input/output port to a low-band receiving port and an operation of feeding the low-band transmit signal fed to a low-band transmitting port to the low-band input/output port; and
    a high-band high frequency switch for switching an operation of feeding the high-band receive signal from the high-band input/output port to a high-band receiving port and an operation of feeding the high-band transmit signal fed to a high-band transmitting port to the high-band input/output port,
    wherein said high-band high frequency switch comprises:
        a first switch element connected between the high-band input/output port and the high-band transmitting port;
        a second switch element with one end connected to the high-band receiving port and the other end grounded;
        a high-band 90-degree phase shifter connected between the high-band input/output port and the high-band receiving port; and
        a high-band control port for controlling on-off operations of said first switch element and said second switch element;
    wherein said low-band high frequency switch comprises:
        a third switch element connected between the low-band input/output port and the low-band transmitting port;
        a fourth switch element with one end connected to the low-band receiving port and the other end grounded;
        a low-band 90-degree phase shifter connected between the low-band input/output port and the low-band receiving port; and
        a low-band control port for controlling on-off operations of said third switch element and said fourth switch element, and
    wherein at least one of said high-band 90-degree phase shifter and said low-band 90-degree phase shifter comprises:
        a high-pass filter circuit; and
        a choke line parallel-connected to said high-pass filter circuit, which is a conducting path of control voltage applied from the high-band control port or the low-band control port.

2. The high frequency switch module of claim 1, wherein at least one of the switch elements ranging from the first switch element to the fourth switch element is formed by using PIN diodes.

3. The high frequency switch module of claim 1, wherein at least one of the switch elements ranging from the first switch element to the fourth switch element is formed by using FET elements.

* * * * *